United States Patent [19]

Leung et al.

[11] Patent Number: 5,223,079

[45] Date of Patent: Jun. 29, 1993

[54] FORMING THIN LIQUID PHASE EPITAXIAL LAYERS

[75] Inventors: Kwong-Hang Leung; Arumugam Satyanarayan, both of Mesa; Ronald W. Slocumb, Scottsdale, all of Ariz.

[73] Assignee: Motorola, Inc., Schaumburg, Ill.

[21] Appl. No.: 670,555

[22] Filed: Mar. 18, 1991

[51] Int. Cl.$^5$ .................. H01L 21/208; C30B 19/00; C30B 19/06
[52] U.S. Cl. ............................. 156/622; 437/121; 437/124; 148/DIG. 101
[58] Field of Search ............... 437/119, 121, 124, 126, 437/130, 133; 156/622; 148/DIG. 101

[56] References Cited

U.S. PATENT DOCUMENTS

| | | | |
|---|---|---|---|
| 3,690,965 | 9/1972 | Bergh et al. | 437/121 |
| 3,853,643 | 12/1974 | Verleur | 437/121 |
| 3,940,296 | 2/1976 | van Oirschot et al. | 437/121 |
| 4,028,148 | 6/1977 | Horikoshi | 437/121 |
| 4,160,682 | 7/1979 | Esseluhn | 437/121 |
| 4,427,464 | 1/1984 | Dutt | 437/121 |

FOREIGN PATENT DOCUMENTS 0087427  7/1980  Japan .................. 437/121

OTHER PUBLICATIONS

Dawson, "High efficiency graded-band-gap $Ga_{1-x}Al_xAs$ light emitting diodes", Journal of Applied Physics, vol. 48, No. 6, Jun. 1977, pp. 2485-2492.

Primary Examiner—Mary Wilczewski
Attorney, Agent, or Firm—Joe E. Barbee

[57] ABSTRACT

A thin layer of liquid phase epitaxial melt material (26) is formed on a wafer (15,16). The thin melt layer (26) is held in contact with the wafer (15,16) while the temperature of the thin melt layer (26) and the wafer (15,16) are reduced to crystallize a portion of the melt material thereby producing thin and accurately controlled epitaxial layers on the wafer (15,16).

3 Claims, 3 Drawing Sheets

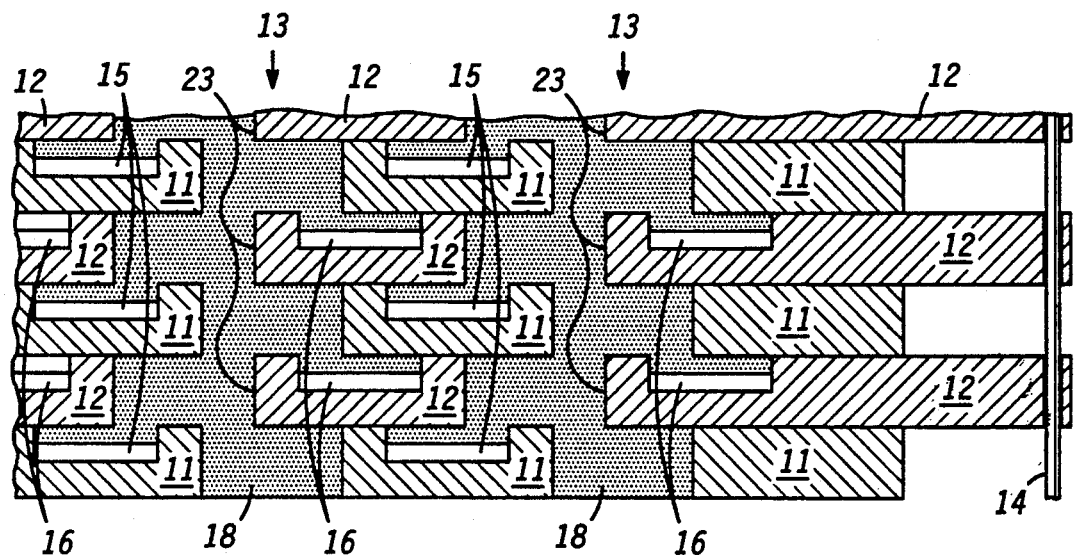
FIG. 4
FIG. 5
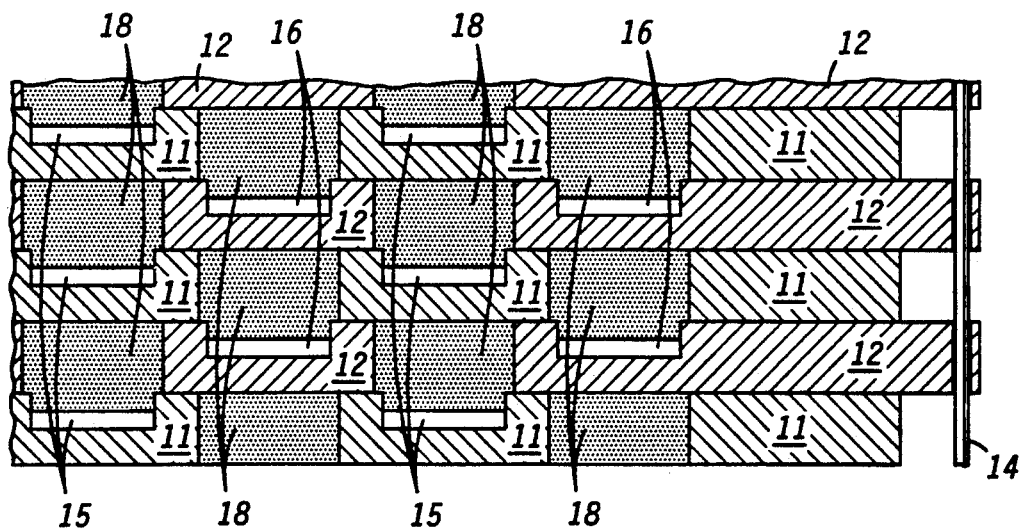

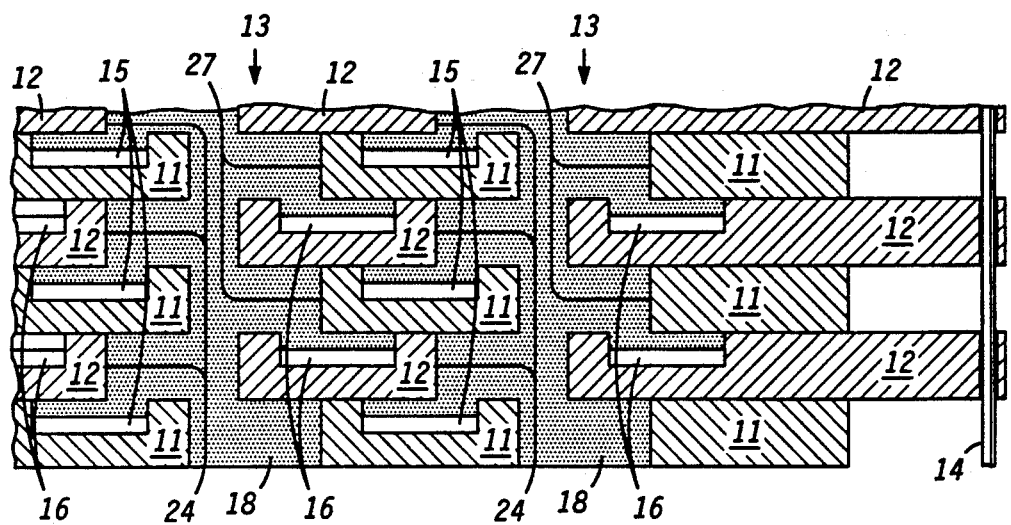
FIG. 6
FIG. 7
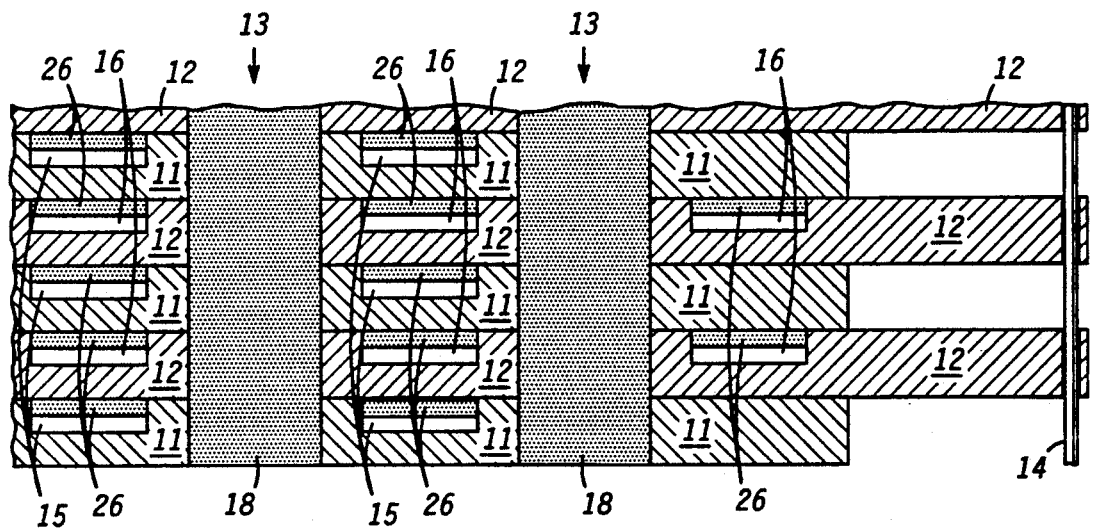

FORMING THIN LIQUID PHASE EPITAXIAL LAYERS

BACKGROUND OF THE INVENTION

The present invention relates, in general, to semiconductor processing methods, and more particularly, to a novel way of forming thin epitaxial layers from a liquid phase solution.

The semiconductor industry has long used crystallization of semiconductor material from a heated liquid phase solution to form epitaxial layers on semiconductor wafers. One particular use was to grow P-type and N-type epitaxial layers on gallium arsenide (GaAs) wafers. The epitaxial layers typically were grown by using a graphite boat which exposed a number of wafers to a melt that contained a solvent of melted semiconductor material such as gallium (Ga), into which was dissolved solutes, such as melted gallium arsenide, and dopants, such as melted silicon. The wafers were pushed into the melt thereby covering them with a thick layer, generally greater than 1000 microns, of the melt. While the wafers were covered, the temperature of the boat and melt was decreased which caused crystallization of material from the melt onto the wafers thereby growing epitaxial layers of the melt material onto the wafers. Cooling of the boat continued until it was cool enough for unloading the wafers. These techniques produced thick epitaxial layers, generally 200 microns or greater, which was thicker than the desired layers. Consequently, the wafers were polished by mechanical and/or chemical means to obtain the desired thin epitaxial layers. Such polishing was time consuming and increased the costs of producing liquid phase epitaxial layers. Polishing operations often broke the brittle gallium arsenide wafers which resulted in reduced yield of the manufacturing process and further increased manufacturing costs. Polishing of the wafers also roughened the epitaxial layer's surface thereby reducing the yield of subsequent processing operations which further increased manufacturing costs. Additionally, wafer polishing can produce stress on the semiconductor material's surface thereby reducing semiconductor device performance and reliability.

Accordingly, it is desirable to have a liquid phase epitaxial process that produces thin epitaxial layers, that reduces wafer breakage, that produces thin epitaxial layers having surfaces suitable for subsequent processing operations, and that reduces the manufacturing costs of producing thin epitaxial layers.

SUMMARY OF THE INVENTION

Briefly stated, the present invention is achieved by creating a thin layer of a liquid phase epitaxial melt material on a semiconductor wafer. The thin melt layer is held in contact with the wafer while the temperature of the thin melt layer and wafer are reduced to crystallize a portion of the thin melt layer material thereby producing thin epitaxial layers on the wafer.

BRIEF DESCRIPTION OF THE DRAWINGS

FIG. 4 is the graphite boat of FIG. 1 at a subsequent stage of the manufacturing process in accordance with the present invention;

FIG. 5 is the graphite boat of FIG. 3 at a further stage of the manufacturing process in accordance with the present invention;

FIG. 6 is the graphite boat of FIG. 4 at an even further stage of the manufacturing process in accordance with the present invention; and FIG. 7 is a cross section of a graphite boat illustrated in a final configuration during the process of growing thin epitaxial layers on semiconductor wafers in accordance with the present invention.

DETAILED DESCRIPTION OF THE DRAWINGS

The present invention provides a process that produces thin, accurately controlled epitaxial layers on a wafer from a melt or liquid phase source. While the invention is described with specific preferred embodiments, it is evident that many alternatives and variations will be apparent to those skilled in the semiconductor art. More specifically the invention has been described for a particular gallium arsenide wafer that is contained in a particular graphite boat, although the method is directly applicable to other III–V semiconductor materials, as well as to other boat structures.

Figure 1:
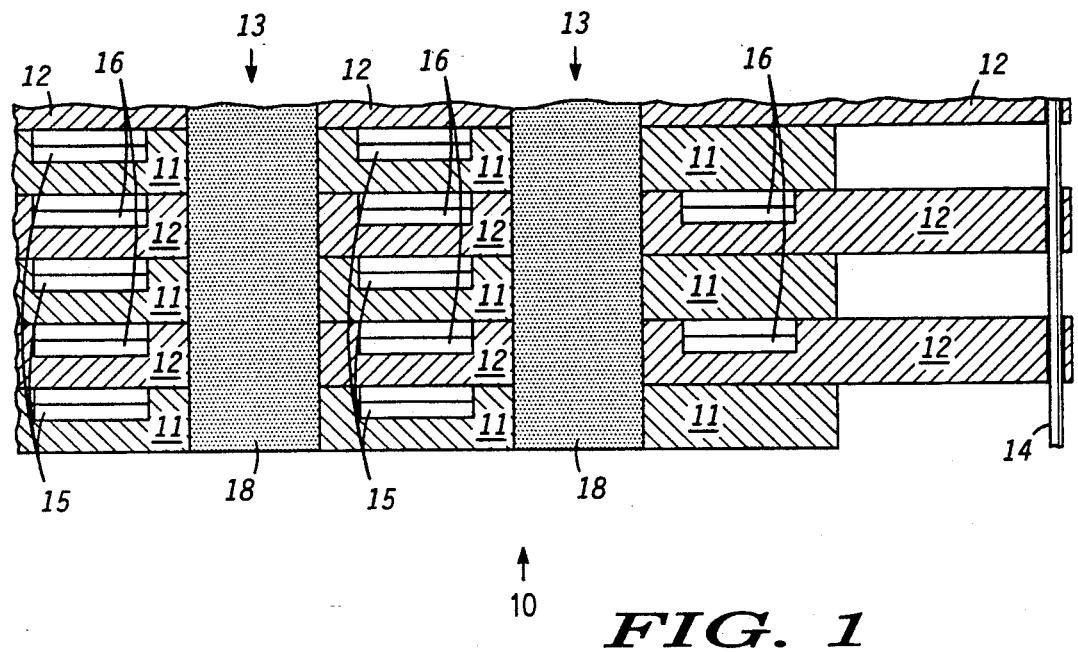
FIG. 1 is a cross section of a portion of a graphite boat used to produce thin epitaxial layers on semiconductor wafers and is illustrated in an initial phase of the manufacturing process in accordance with the present invention.

Referring to FIG. 1, a cross section of a portion of a graphite boat 10 that is used to grow thin epitaxial layers on semiconductor wafers includes stationary graphite plates 11 and movable graphite sliders 12 that form reservoirs 13.

Figure 2:
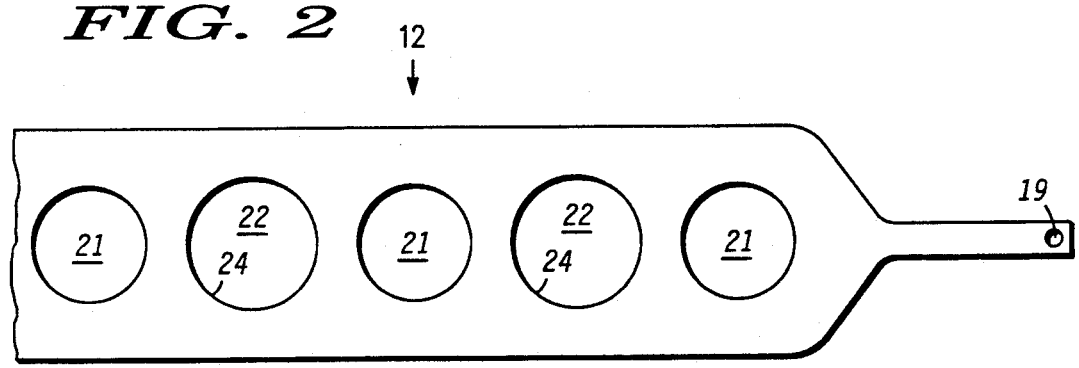
FIG. 2 is a plan view of a portion of a movable graphite slider that is an element of the boat of FIG. 1 in accordance with the present invention.
Figure 3:
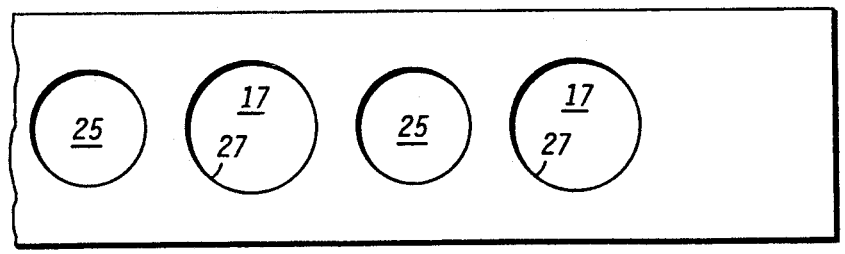
FIG. 3 is a plan view of a portion of a stationary graphite plate that is an element of the boat of FIG. 1 in accordance with the present invention.

Referring to both FIG. 2 and FIG. 3, a plan view of a portion of slider 12 shown in FIG. 2 and a portion of plate 11 shown in FIG. 3 will assist in understanding the operation of boat 10 shown in FIG. 1. Referring primarily to FIG. 2, slider 12 is a single piece of graphite that has a shape which is similar to a paddle. Recesses 21 are used to hold semiconductor wafers, and have a depth into slider 12 that is sufficient to accept a wafer plus a thin layer of melt material that will be used to grow a thin epitaxial layer on the wafer as will be shown hereinafter. Each opening 22 through slider 12 forms a portion of each reservoir 13 that is shown in FIG. 1. As will be shown hereinafter, inner perimeter surface 24 of each opening 22 will be used to control movement of material in each reservoir 13 (shown in FIG. ensuring that only a thin layer of material is used to form thin epitaxial layers. Slider 12 also has an opening 19 through which a control rod is inserted in order to control the movement of slider 12. Referring primarily to FIG. 3, stationary plate 11 also is a single piece of graphite having openings 17 through plate 11 which are also used to form a portion of each reservoir 3 (of FIG. 1). Each recess 25 is used to hold a semiconductor wafer and has a depth into plate 11 that is sufficient to accept a wafer plus a thin layer of melt material that will be used to grow a thin epitaxial layer on the wafer. Inner perimeter surface 27 of opening 17 is used to ensure that a thin layer of melt material is used to form epitaxial layers as will be explained hereinafter.

Referring once again to FIG. 1, plates 11 and sliders 12 are alternately stacked to form boat 10. Each slider 12 holds a wafer 16 in each recess 21 (shown in FIG. 2) and each plate 11 holds a wafer 15 in each recess 25 (shown in FIG. 3). During the process of forming epitaxial layers on wafers 15 and 16, boat 10 is contained in a furnace that has an accurately controlled temperature which is sufficient to melt III-V semiconductor material that is contained in reservoir 13. This III-V semiconductor material generally includes a material, such as gallium, that acts as a solvent to dissolve predetermined amounts of a solute, such as gallium arsenide, and dopants, such as silicon, thereby forming a liquid phase solution or melt 18. For example, a melt that contains both gallium and gallium arsenide that are doped with silicon is typically maintained at a temperature between 850 and 920 degrees centigrade. It should be noted that wafers 15 and 16 could be heated to a temperature that is different than the temperatures of melt 18 although this is not the preferred method. Since each slider 12 will be pushed into melt 18, simultaneous movement of all sliders 12 is facilitated by a control rod 14 which interconnects each slider 12. In the preferred embodiment, each wafer 15 and 16 is a gallium arsenide wafer, and melt 18 contains gallium arsenide and silicon that are dissolved into a liquid gallium solvent.

Referring to FIG. 4, as each slider 12 is pushed into melt 18 each wafer 16 and each wafer 15 is exposed to melt 18.

Referring to FIG. 5, at the point that each slider 12 is completely pushed into melt 18, each wafer 15 and 16 is covered with a thick layer of melt 18. Previous methods for producing epitaxial layers from melt 18 utilized the configuration of sliders 12 and plates 11 shown in FIG. 5 to produce thick, approximately 200 microns thick, epitaxial layers on wafers 15 and 16.

It has been found that providing a thin layer of melt material on each wafer 15 and 16 facilitates forming thin epitaxial layers of accurately controlled thickness. The thickness of epitaxial layers grown from liquid phase solutions or melts is determined by the thickness of the melt from which the layer is crystallized, the rate at which the melt is cooled, and the diffusivity of the solute in the solvent used for the melt. The relationship of these parameters depends on how far the solute diffuses through the melt solution in a given time period, or the solute's diffusion length as it is generally referred to in the art. When the solute's diffusion length is comparable to the thickness of the melt used to grow the layer, the parameters are related by the following equation:

$$d = ((R_c W^3)/(C_s m D))((Dt)/(W^2) - \tfrac{1}{3})$$

where:
 $d$ = epitaxial layer thickness,
 $R_c$ = rate at which boat 10 is cooled,
 $W$ = thickness of the melt used to grow the epitaxial layer,
 $C_s$ = dopant concentration in the solid form of the melt material e.g. As is $2.21 \times 10^{22}$ atoms/cm$^3$ in Ga,
 $t$ = time period used for cooling boat 10,
 $m$ = slope of the liquidus curve from the phase diagram of the solvent used in melt 18, and
 $D$ = diffusivity of the solute in the solvent.

Consequently, providing a thin layer of melt material (W) on each wafer 15 and 16 can be used to accurately control the thickness (d) of a liquid phase epitaxial layer that is grown on each wafer 15 and 16.

It has been found that such a thin layer of melt 18 can be formed by controlling the depth of each wafer 15 and 16 in respective recesses 21 and 25 (shown in FIG. 2), and by using the movement of slider 12 to remove portions of melt 18 from wafers 15 and 16 thereby capturing a predetermined amount of melt 18 on wafers 15 and 16.

Referring to FIG. 6, in order to form a thin layer of melt 18 on each wafer 15 and 16, slider 12 is now pulled back toward its' original position by control rod 14. During the movement of slider 12, surface 24 pulls a portion of melt 18 that is covering each wafer 15 back into reservoir 13 leaving a thin layer of melt 18 on each wafer 15. Similarly, surface 27 of plate 11 levels melt 18 that is covering each wafer 16 and pushes a portion of melt 18 back into reservoir 13 leaving a thin layer of melt 18 on each wafer 16.

Referring to FIG. 7, once slider 12 has returned to the original starting position, a thin melt layer 26 remains covering each wafer 15 and 16. The height of layer 26 over wafers 16 is determined by the depth of recess 21 (shown in FIG. 2) minus the thickness of wafer 16. Similarly, the height of layer 26 over wafers 15 is determined by the depth of recess 25 (shown in FIG. 3) minus the thickness of wafer 15. The height of thin melt layer 26 can be adjusted by placing spacers under each wafer 15 and 16, or by other similar means.

Once the desired thin melt layer 26 is formed, a thin epitaxial layer is grown on each wafer 15 and 16 by uniformly cooling boat 10 at a predetermined rate and for a predetermined time, as determined by using the height of layer 26 as "W" in the equation of FIG. 5. In most cases, boat 10 is cooled at a rate between one-half a degree centigrade per minute and five degrees centigrade per minute until it reaches a predetermined unloading temperature. Typically the unloading temperature maintains the material in reservoir 13 and the uncrystallized material in layer 26 in a liquid state thereby facilitating easy removal. Once boat 10 has cooled to the predetermined unloading temperature, boat 10 is removed from the furnace, each wafer 15 and 16 is unloaded from boat 10, and uncrystallized portions of layer 26 are rinsed, typically using HCl, from each wafer 15 and 16. In the preferred embodiment, the unloading temperature is greater than fifty degrees centigrade. The thin accurately controlled epitaxial layers produced by this process do not require mechanical or chemical polishing thereby improving yields of subsequent processing operations by providing smooth epitaxial layer surfaces. Both the increased yield and elimination of polishing aid in reducing manufacturing costs of wafers 15 and 16.

By now it should be appreciated that there has been provided a novel way to form thin epitaxial layers from a liquid phase source or melt onto a semiconductor wafer. Use of a thin layer of melt material permits growing thin accurately controlled epitaxial layers that do not require mechanical or chemical polishing, thereby reducing the number of broken wafers and decreasing the wafer's manufacturing costs. Elimination of wafer polishing also provides smooth surfaces on the epitaxial layers which result in higher yield of final semiconductor devices, reduced manufacturing costs, and improved semiconductor device reliability.

We claim:

1. A method of growing thin epitaxial layers of gallium arsenide (GaAs) material from a gallium arsenide melt which comprises:

heating to a first temperature a graphite boat having a plurality of reservoirs that contain a melt including at least gallium arsenide and silicon that are dissolved in melted gallium, having a plurality of movable graphite sliders, having a plurality of fixed graphite plates, and having a plurality of recesses that have a depth wherein a first portion of the recesses are in each slider and a second portion of the recesses are in each plate and each recess contains a gallium arsenide wafer that has a thickness;

covering each wafer with the melt by pushing each slider into the melt wherein the melt that is covering each wafer has a thin first section that is within each recess and a second section outside each recess;

removing the second section of the melt that is covering each wafer by returning the second section of the melt back to the plurality of reservoirs while leaving the thin first section covering each wafer; and growing an epitaxial layer on each wafer by cooling the graphite boat at a rate of approximately 0.5 to 5.0 degrees Celsius per minute until reaching an unloading temperature thereby crystallizing a portion of the thin first section onto each wafer.

2. The method of claim 1 wherein removing the second section of the melt includes removing the second section of the melt that is covering each wafer by pulling each slider out of the melt and returning the slider back to an original position.

3. The method of claim 1 further including the thin first section that is in each recess having a height that is determined by the depth of each recess minus the thickness of the wafer in each recess.

* * * * *